United States Patent
Wang

(10) Patent No.: US 10,298,479 B2
(45) Date of Patent: May 21, 2019

(54) METHOD OF MONITORING A SERVER RACK SYSTEM, AND THE SERVER RACK SYSTEM

(71) Applicant: Mitac Computing Technology Corporation, Taoyuan (TW)

(72) Inventor: Po-Wei Wang, Taoyuan (TW)

(73) Assignee: MITAC COMPUTING TECHNOLOGY CORPORATION, Taoyuan (TW)

( * ) Notice: Subject to any disclaimer, the term of this patent is extended or adjusted under 35 U.S.C. 154(b) by 293 days.

(21) Appl. No.: 15/150,275

(22) Filed: May 9, 2016

(65) Prior Publication Data

US 2017/0324636 A1   Nov. 9, 2017

(51) Int. Cl.
*G06F 15/173* (2006.01)
*H04L 12/26* (2006.01)
*H04L 12/24* (2006.01)
*G06F 1/3203* (2019.01)
*H05K 7/20* (2006.01)

(52) U.S. Cl.
CPC ............ *H04L 43/10* (2013.01); *G06F 1/3203* (2013.01); *H04L 41/0806* (2013.01); *H04L 43/08* (2013.01); *H05K 7/20836* (2013.01)

(58) Field of Classification Search
CPC .......................... H01J 37/32935; H04W 24/08
See application file for complete search history.

(56) References Cited

U.S. PATENT DOCUMENTS

| | | | |
|---|---|---|---|
| 7,589,624 B2 | 9/2009 | Hatakeyama | |
| 9,158,310 B2* | 10/2015 | Geissler | G05D 23/1932 |
| 2013/0033213 A1* | 2/2013 | Wang | F04D 25/166 |
| | | | 318/472 |
| 2013/0162438 A1* | 6/2013 | Wu | G06F 1/20 |
| | | | 340/670 |
| 2014/0142764 A1* | 5/2014 | Chen | H05K 7/20209 |
| | | | 700/276 |
| 2016/0120070 A1* | 4/2016 | Myrah | H05K 7/20836 |
| | | | 700/275 |

FOREIGN PATENT DOCUMENTS

| | | |
|---|---|---|
| TW | 201327146 A1 | 7/2013 |
| TW | 201351132 A | 12/2013 |
| TW | 201505400 A | 2/2015 |
| TW | 201516672 A | 5/2015 |
| TW | 201516708 A | 5/2015 |

* cited by examiner

*Primary Examiner* — Brian Whipple
*Assistant Examiner* — Tesfu N Mekonen
(74) *Attorney, Agent, or Firm* — Brinks Gilson & Lione

(57) ABSTRACT

A method of monitoring a server rack system includes: initializing each of a rack management controller (RMC), a rack back plate (RBP) and a baseboard management controller (BMC); transmitting by the RMC an initiation message to RBP; transmitting by the RBP initiation messages to the BMC and the RMC, respectively; transmitting by the BMC an initiation message to RBP transmitting by the BMC a real-time monitoring output associated with a condition of a server to the RBP after receiving the initiation message transmitted by the RBP; and transmitting by the RBP at least a portion of the real-time monitoring output received from the BMC to the RMC after receiving the initiation message transmitted by the RMC.

15 Claims, 5 Drawing Sheets ically to a real-time monitoring output associated with a condition of the server via the fourth communication interface to the third communication interface of the RBP after receiving the initiation message transmitted by the RBP and after initialization of the third processor has finished. The second processor of the RBP is further programmed to transmit periodically at least a portion of the real-time monitoring output received from the BMC via the second communication interface to the first communication interface of the RMC after receiving the initiation message transmitted by the RMC.

METHOD OF MONITORING A SERVER RACK SYSTEM, AND THE SERVER RACK SYSTEM

FIELD

The disclosure relates to a method and a server rack system, more particularly to a method of monitoring a server rack system, and a server rack system implementing the method.

BACKGROUND

With development of the computer industry and advancement of network technology, a rack server system has been vastly used in a variety of industries, such as the telecommunication industry, the bank industry and the video game industry. A rack server system is able to accommodate a plurality of server nodes. Each server node may be an independently operating system, and includes at least one central processing unit (CPU), a motherboard, memory, a hard disk drive, and so forth. However, since these server nodes are densely arranged in the rack server system, heat dissipation and power management should be carefully considered.

Generally, the rack server system is provided with a Rack Management Controller (RMC), a plurality of Rack Back Planes (RBPs) connected to the RMC, and a plurality of server nodes. Each of the RBPs is connected to corresponding multiple ones of the server nodes. During operation of the server nodes, the RMC first polls the server nodes one by one for parameters associated with operation of the respective server node, such as temperature or voltage of a CPU. The RMC then decides controls of the server rack system, such as to speed up or slow down rotation of a fan, based on the parameters collected through polling. However, during the process of polling the server nodes one by one, the RMC is not only required to send a request to the server node first, but is also required to wait a period of time for the server node to respond with the parameters. Moreover, when the parameters are not received from the server node due to breakdown or other issues of the server node, the RMC is required to wait until a timeout has elapsed. As a result, it takes several minutes for polling all of the server nodes. More importantly, since the RMC controls the server rack system based on parameters collected a few minutes ago, issues of the server rack system cannot be addressed in real time, so the RMC is not capable of instantly responding to different situations in real time.

SUMMARY

Therefore, an object of the disclosure is to provide a method monitoring a server rack system and a server rack system that can alleviate at least one of the drawbacks of the prior art.

According to a first aspect of the disclosure, the method is configured for monitoring a server rack system. The server rack system includes a rack management controller (RMC), a rack back plane (RBP) connected to the RMC, and a server connected to the RBP. The RMC includes a first processor and a first communication interface. The RBP includes a second processor, a second communication interface and a third communication interface. The server includes a baseboard management controller (BMC) that includes a third processor and a fourth communication interface. The method includes the following steps of:

initializing each of the first processor of the RMC, the second processor of the RBP and the third processor of the BMC;

transmitting, by the first processor of the RMC, an initiation message via the first communication interface to the second communication interface of the RBP after initialization of the first processor has finished;

transmitting, by the second processor of the RBP, an initiation message via the third communication interface to the fourth communication interface of the BMC after initialization of the second processor has finished;

transmitting periodically, by the third processor of the BMC, a real-time monitoring output associated with a condition of the server via the fourth communication interface to the third communication interface of the RBP after receiving the initiation message transmitted by the RBP and after initialization of the third processor has finished; and transmitting periodically, by the second processor of the RBP, at least a portion of the real-time monitoring output received from the BMC via the second communication interface to the first communication interface of the RMC after receiving the initiation message transmitted by the RMC.

According to a second aspect of the disclosure, the server rack system includes a rack management controller (RMC), a rack back plane (RBP) and a server. The RMC includes a first processor and a first communication interface. The RBP is connected to the RMC, and includes a second processor, a second communication interface connected to the first communication interface, and a third communication interface. The server is connected to the RBP, and includes a baseboard management controller (BMC) that includes a third processor and a fourth communication interface connected to the third communication interface.

Each of the first processor of the RMC, the second processor of the RBP and the third processor of the BMC is initialized. The first processor of the RMC is programmed to transmit an initiation message via the first communication interface to the second communication interface of the RBP after initialization of the first processor has finished. The second processor of the RBP is programmed to transmit an initiation message via the third communication interface to the fourth communication interface of the BMC after initialization of the second processor has finished. The third processor of the BMC is programmed to transmit periodically a real-time monitoring output associated with a condition of the server via the fourth communication interface to the third communication interface of the RBP after receiving the initiation message transmitted by the RBP and after initialization of the third processor has finished. The second processor of the RBP is further programmed to transmit periodically at least a portion of the real-time monitoring output received from the BMC via the second communication interface to the first communication interface of the RMC after receiving the initiation message transmitted by the RMC.

An effect of the method of monitoring a server rack system according to this disclosure resides in that, since polling is not adopted for collecting status parameters which are frequently transmitted (i.e., the real-time monitoring output), and since an approach of unidirectional transmission is adopted for saving time in data collection, the RMC is allowed to respond instantly based on real-time data. Further, since data associated with the server to be collected by the RMC may be sorted first by the RBP before passing to the RMC, data throughput may be reduced and channel transmission efficiency may be increased. In addition, a monitored result associated with the server is processed by the RBP so as to alleviate workload of the RMC and so as to lower the difficulty in developing software of the RMC.

BRIEF DESCRIPTION OF THE DRAWINGS

Other features and advantages of the disclosure will become apparent in the following detailed description of embodiment(s) with reference to the accompanying drawings, of which.

DETAILED DESCRIPTION

Figure 1:
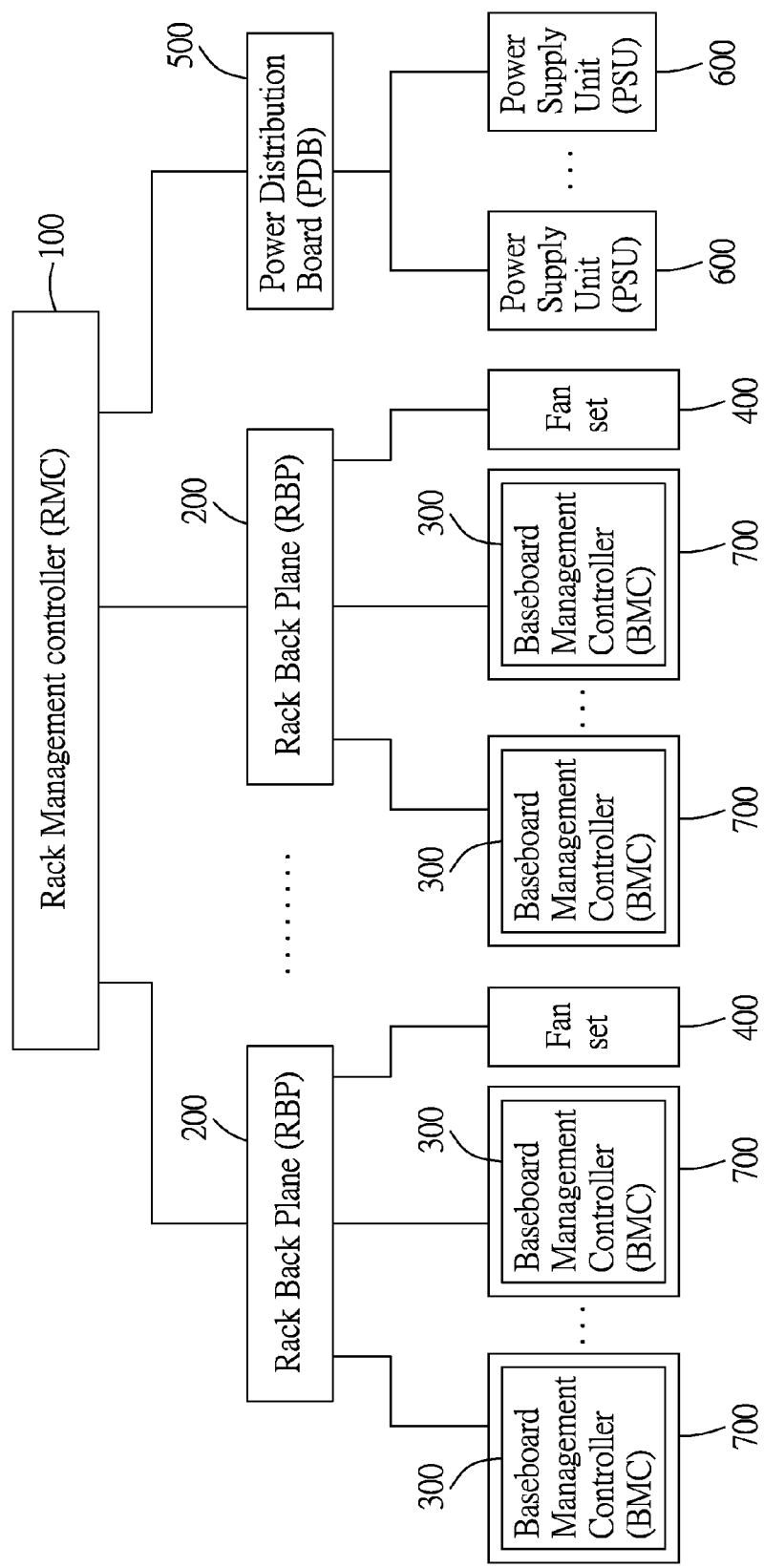
FIG. 1 is a block diagram illustrating one embodiment of a server rack system according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, a block diagram illustrates an embodiment of a server rack system according to the disclosure. The server rack system includes a Rack Management Controller (RMC) 100, a plurality of servers 700 and at least one Rack Back Plane (RBP) 200 (multiple RBPs 200 are given as an example in FIG. 1). Each of the servers 700 includes a Baseboard Management Controller (BMC) 300. Each of the RBPs interconnects the RMC 100 and corresponding multiple ones of the BMCs 300 of corresponding multiple ones of the servers 700. Each of the servers 700 is a node capable of independent operation and including electronic components, such as a motherboard, a central processing unit (CPU), a southbridge, a northbridge, volatile memory, a storage unit and a network chip. The storage unit is exemplified as a logical disk array, such as Redundant Array of Inexpensive Disks (RAID), or Just a Bunch of Disks (JBOD). Alternatively, the storage unit may be a non-volatile storage device, such as a Hard Disk Drive (HDD).

The server rack system further includes a plurality of fan sets 400. Each of the RBPs 200 is connected to a respective one of the fan sets 400, for heat dissipation of the corresponding ones of the servers 700 which are connected to the RBP 200. Each of the fan sets 400 includes one or more fans. In some embodiments, the RBP 200 is communicably connected to the respective fan set 400 in a manner of Intelligent Platform Management Bus (IPMB) or Pulse Width Modulation (PWM) signal transmission.

Figure 2:
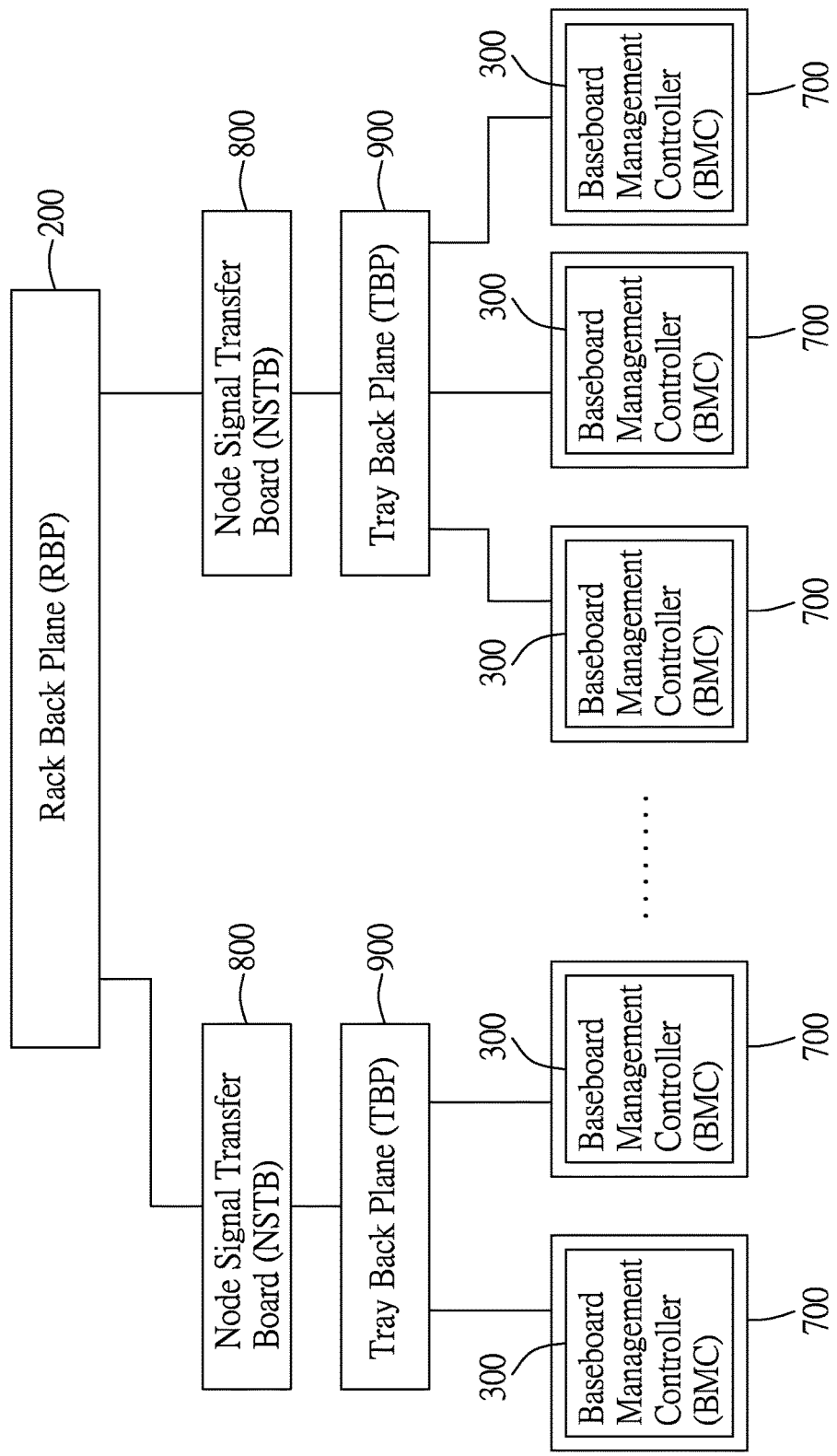
FIG. 2 is a block diagram illustrating one embodiment of electrical connections between a rack back plate (RBP) and servers.

Referring to FIG. 2, a block diagram illustrates connections between one of the RBPs 200 and corresponding multiple ones of the BMCs 300 of corresponding multiple ones of the servers 700. The RBP 200 is connected to the BMCs 300 of the servers 700 via at least one Node Signal Transfer Board (NSTB) 800 and at least one Tray Back Plane (TBP) 900. The NSTB 800 is an intermediate interface between the RBP 200 and the TBP 900. The NSTB 800 has one end connected to the RBP 200 via a Peripheral Component Interconnect Express (PCIe) interface, and has another end connected to the TBP 900 via a cable. However, practical implementation of these interfaces is not limited to the disclosure herein. The TBP 900 is a back plane for a server chassis for realizing functions such as electricity access, power distribution and signal conversion. The RBP 200 may be connected to a plurality of NSTBs 800, and each of the NSTBs 800 may be connected to multiple BMCs 300 of respective servers 700 via a respective one of a plurality of TBPs 900.

Referring once again to FIG. 1, the server rack system further includes a Power Distribution Board (PDB) 500 and a plurality of Power Supply Units (PSUs) 600. The RMC 100 is connected to the PSUs 600 via the PDB 500. In one embodiment, the server rack system includes ten PSUs 600 and ten RBPs 200. Each of the PSUs 600 correspondingly provides operational power to a respective one of the RBPs 200, to the servers 700 correspondingly connected to the respective RBP 200, and to the fan sets 400 connected to the respective RBP 200. However, a number of the PSUs 600 and a number of the RBPs 200 in practice are not limited to the disclosure herein.

Figure 3:
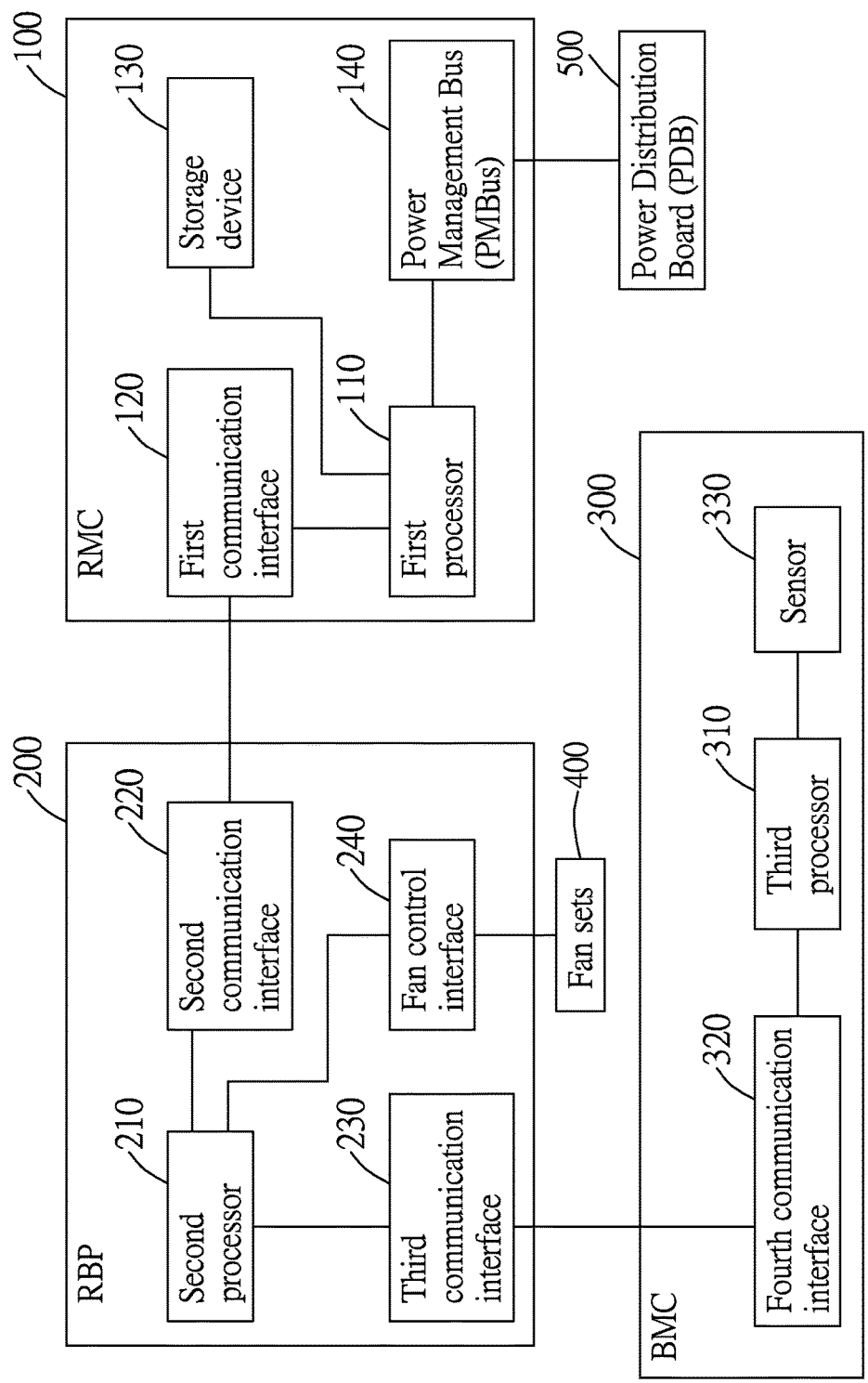
FIG. 3 is a block diagram illustrating one embodiment of detailed structure of the server rack system according to the disclosure.

Referring to FIG. 3, a block diagram showing components of an embodiment of the server rack system according to the disclosure is provided. The RMC 100 of the server rack system includes a first processor 110, a first communication interface 120, a storage device 130 and a Power Management Bus (PMBus) 140. The first processor 110 is connected electrically to the first communication interface 120, the storage device 130 and the PMBus 140. The PMBus 140 is connected electrically to the PDB 500 such that the first processor 110 is able to execute an action command for transmitting a control signal to the PDB 500 via the PMBus 140 so as to control operations of each of the PSUs 600.

The RBP 200 includes a second processor 210, a second communication interface 220 connected to the first communication interface 120, a third communication interface 230 and a fan control interface 240. The second processor 220 is connected electrically to the second communication interface 220, the third communication interface 230 and the fan control interface 240. The fan control interface 240 is connected electrically to the fan set 400. The fan control interface 240 includes a plurality of Input/Output (I/O) pins allowing the second processor 210 to transmit another control signal to the fan set 400 via the fan control interface 240 so as to control fan speed of the fan set 400. The third communication interface 230 includes a terminal compatible with the Peripheral Component Interconnect Express (PCIe) standard, and is configured for transmission of at least one of an I²C signal, a PWM signal, a signal (referred to as "TACH") from a tachometer, or a general purpose I/O (GPIO) signal via pins of the terminal. However, the third communication interface 230 is not limited to the disclosed embodiment herein, and may include a terminal that is compatible with the RJ45 standard, the RS232 standard, the RS485 standard and so forth.

The BMC 300 includes a third processor 310, a fourth communication interface 320 connected to said third communication interface 230, and a sensor management module 330. The third processor 310 is connected electrically to the fourth communication interface 320 and the sensor management module 330. The sensor management module 330 is configured to monitor a status of at least one sensor disposed on the motherboard of each of the servers 700. The sensor is exemplified as a temperature sensor for detecting an ambient temperature of certain space or a temperature of an electronic component in the server rack system. However, the sensor is not limited to the disclosed embodiment herein, and may be a voltage detector for detecting an operating voltage of an electronic component of the server rack system, or a power detector for detecting power consumption of an electronic component of the server rack system. Data measured by the sensor is transmitted to the sensor management module 300 for data integration thereby. In other words, the sensor management module 300 collects the data measured by the sensor of each of the servers 700 for subsequent processing by the third processor 310 of the BMC 300. The electronic component is one of the aforementioned CPU, the sourthbridge, the northbridge, volatile memory, the storage unit, the network chip and so forth.

The BMC 300 is connected to the third communication interface 230 of the RBP 200 via the fourth communication interface 320 (also via the NSTB 800 and via the TBP 900 as shown in FIG. 2), so as to transmit measured data (e.g., temperature, operating voltage or power consumption) collected by the sensor management module 330 to the RBP 200. The fourth communication interface 320 may include a plurality of I/O pins for signal transmission by defining different functions of the I/O pins. The second processor 210 of the RBP 200 is programmed to determine whether or not to adjust the fan speed of the fan set 400 according to the measured data. The second processor 210 of the RBP 200 is further programmed to transmit the measured data that is collected by the sensor management module 330 and received from the BMC 300, or a system event log to the first communication interface 120 of the RMC 100 via the second communication interface 220. The first processor 110 of the RMC 100 is programmed to store the measured data or the system event log received via the first communication interface 120 in the storage device 130, or alternatively, may be programmed to execute the action command based on the measured data. The first communication interface 120 and the second communication interface 220 adopt one of the Inter-Integrated Circuit ($I^2C$) bus, the RS-485 standard, the Universal Serial Bus (USB), and the Ethernet technology. The storage device 130 is exemplified as nonvolatile memory, such as flash memory. The first processor 110, the second processor 210 and the third processor 310 are processors capable of execution of programming language.

Figure 4:
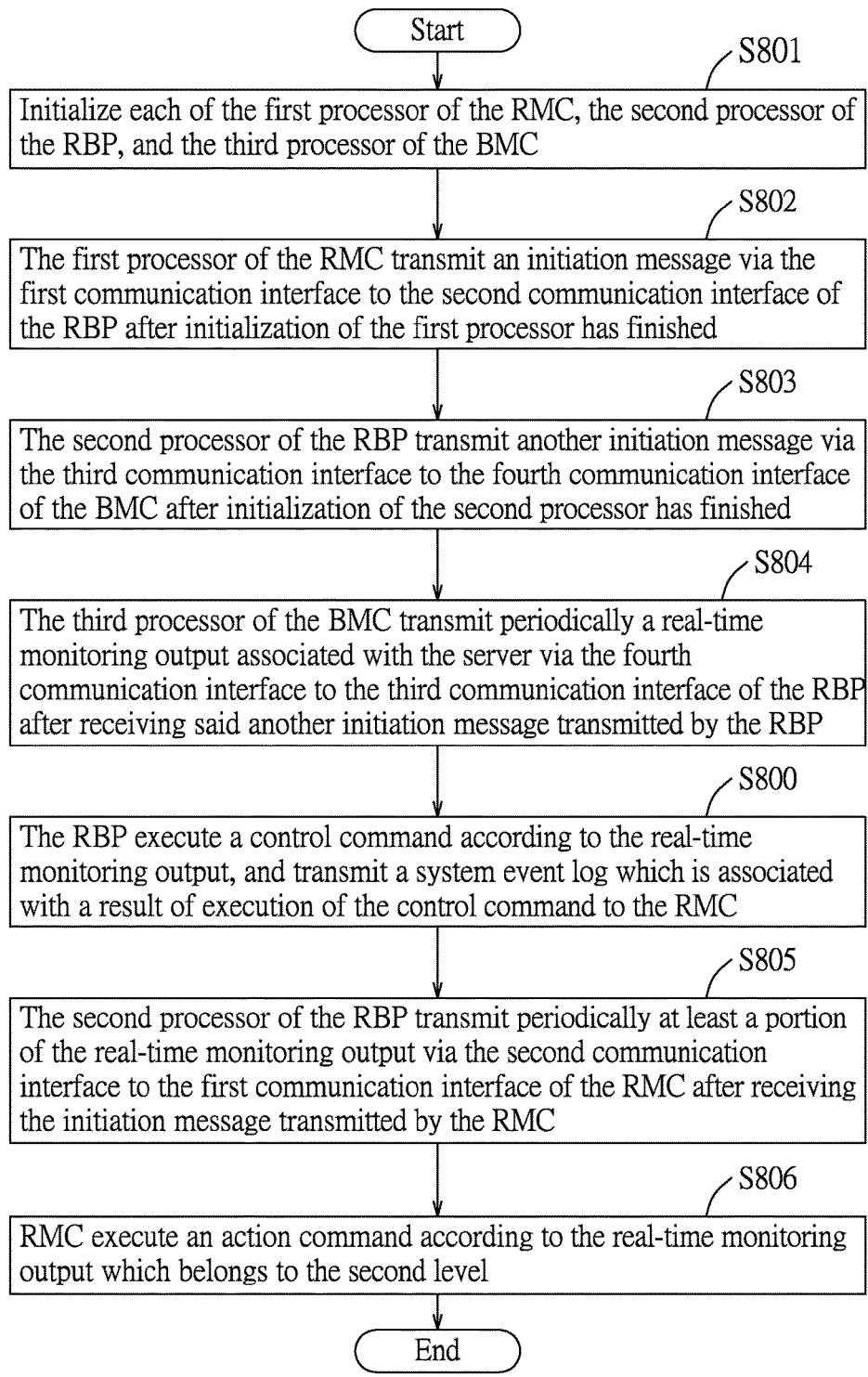
FIG. 4 is a flowchart illustrating one embodiment of a method of monitoring a server rack system according to the disclosure.
Figure 5:
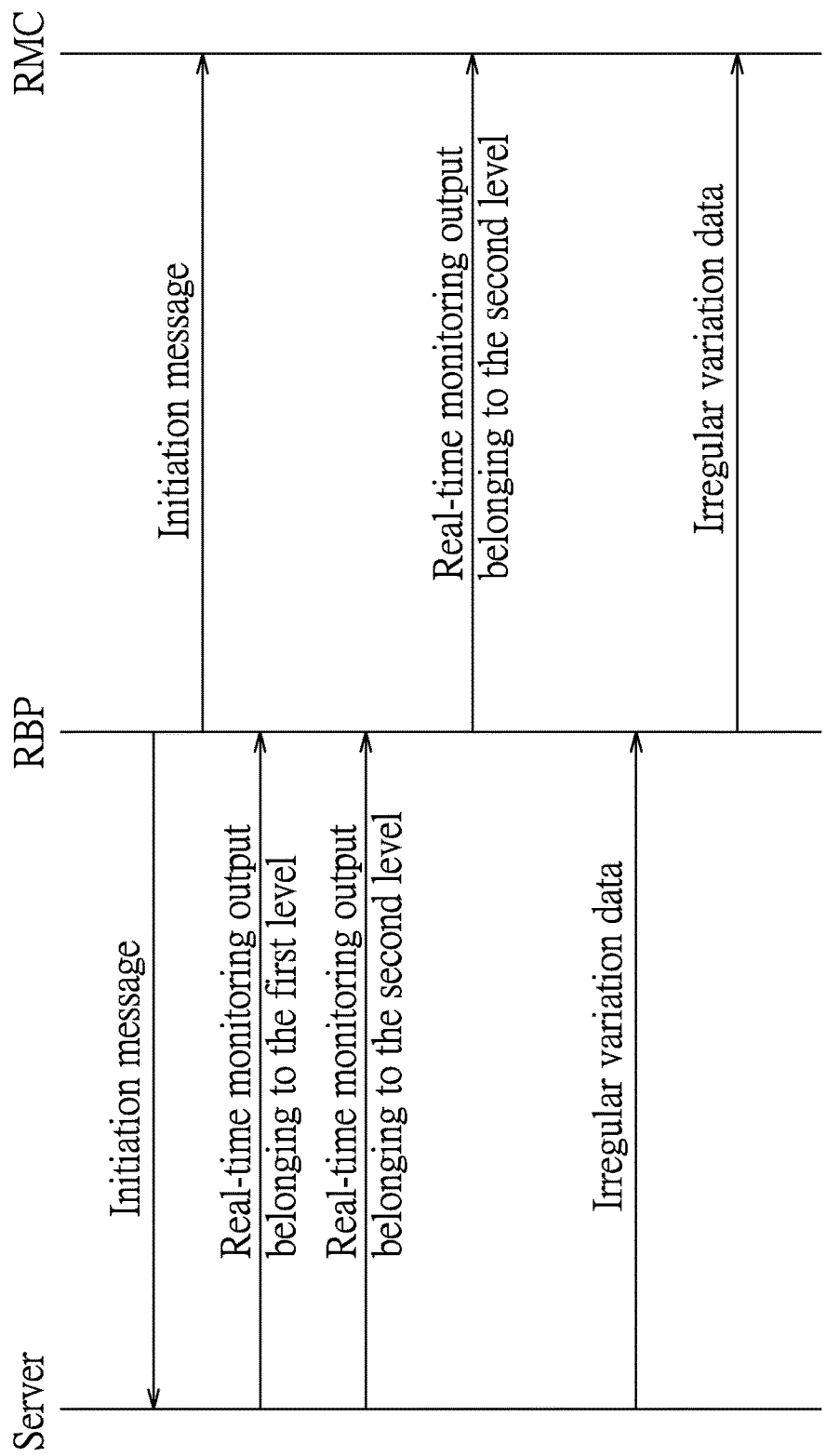
FIG. 5 is a schematic diagram showing one embodiment of signal transmissions according to the disclosure.

FIG. 4 is a flow chart illustrating an embodiment of a method of monitoring a server rack system according to the disclosure. FIG. 5 is a schematic diagram illustrating an embodiment of signal transmissions associated with the method of the disclosure.

In the following description, only one RBP 200 and one BMC of a server 700 are given as an example for explanatory purposes.

In step S801, after the server rack system is activated, each of the first processor 110 of the RMC 100, the second processor 210 of the RBP 200, and the third processor 310 of the BMC 300 is initialized.

Initialization of each of the first processor 110, the second processor 210 and the third processor 310, making each of the RMC 100, the RBP 200 and the BMC 300 capable of executing its respective functions, configures each of the RMC 100, the RBP 200 and the BMC 300 to issue an initiation message to other components connected thereto based on preset communication protocols.

In step S802, the first processor 110 of the RMC 100 transmits an initiation message via the first communication interface 120 to the second communication interface 220 of the RBP 200 after initialization of the first processor 110 of the RMC 100 has finished. Accordingly, after receiving the initiation message transmitted by the RMC 100, the RBP 200 is notified that the initialization of the RMC 100 (i.e., equivalent to initialization of the first processor 110) has finished, and the RBP 200 is prepared to transmit at least a portion of a real-time monitoring output which is associated with a condition of the server 700 connected to the RBP 200 (e.g., the aforementioned measured data), or other information (e.g., the aforementioned system event log) to the RMC 100.

In step S803, the second processor 210 of the RBP 200 transmits another initiation message via the third communication interface 230 to the fourth communication interface 320 of the BMC 300 after initialization of the second processor 210 of the RBP 200 has finished. Accordingly, after receiving said another initiation message transmitted by the RBP 200, the BMC 300 is notified that the initialization of the RBP 200 (i.e., equivalent to initialization of the second processor 210) has finished, and the BMC 300 is prepared to transmit the real-time monitoring output or other information to the RBP 200.

On the other hand, the second processor 210 of the RBP 200 further transmits still another initiation message via the second communication interface 220 to the first communication interface 120 of the RMC 100 after initialization of the second processor 210 of the RBP 200 has finished. Accordingly, after receiving said still another initiation message transmitted by the RBP 200, the RMC 100 is notified that the initialization of the RBP 200 has finished, and the RMC 100 is prepared to receive the at least a portion of the real-time monitoring output or other information from the RBP 200. The RMC 100 may also be prepared to transmit data to the RBP 200. Similarly, the third processor 310 of the BMC 300 further transmits yet another initiation message via the fourth communication interface 320 to the third communication interface 230 of the RBP 200 after initialization of the third processor 310 of the BMC 300 has finished. Accordingly, after receiving said yet another initiation message transmitted by the BMC 300, the RBP 200 is notified that the initialization of the BMC 300 (i.e., equivalent to initialization of the third processor 310) has finished, and the RBP 200 is prepared to receive the real-time monitoring output or other information from the BMC 300. The RBP 200 may also be prepared to transmit data to the BMC 300. As a result, when any of the aforementioned initiation messages is received, it may be asserted that initialization of a source of the initiation message has finished, so that a determination as to whether or not to transmit data to the source of the initiation message (which is a connected component with respect to the recipient of the initiation message) can be made. In other words, each of the aforementioned RMC 100, RBP 200 and BMC 300 is configured to transmit the initiation message to the respective connected component(s) after initialization thereof has finished, so as to notify the connected component(s) which receives the initiation message that it is allowable to automatically transmit/receive data (e.g., the real-time monitoring output) to/from the RMC 100, the RBP 200 or the BMC 300 that has been initialized. That is to say, each of the RMC 100, the RBP 200 and the BMC 300 may take the initiative to transmit data.

It should be noted that, compared with a conventional approach to polling server nodes one by one, in which the RBPs 200 and the BMCs 300 only passively provide parameters associated with operation of the respective server node after being polled, the method of this disclosure allows the RBPs 200 and the BMCs 300 to actively provide the real-time monitoring output after receiving the initiation message from the connected component(s) at a higher level, i.e., the RMC 100 or the RBPs 200. Therefore, the RBPs 200 and BMCs 300 have made transitions from being passive roles to being active roles.

In step S804, the third processor 310 of the BMC 300 transmits periodically the real-time monitoring output which is associated with the condition of the server 700 connected to the RBP 200 via the fourth communication interface 320 to the third communication interface 230 of the RBP 200 after receiving the initiation message transmitted by the RBP 200 and after initialization of the third processor 310 has finished. The real-time monitoring output may be the measured data collected by the sensor management module 330, that is one of the ambient temperature in the server rack system detected by the sensor disposed in the server rack system (i.e., the temperature sensor), the temperature of the electronic component of the server rack system detected by the sensor (i.e., the temperature sensor), the operating voltage of the electronic component of the server rack system detected by the sensor (i.e., the voltage detector), and the power consumption of the electronic component of the server rack system detected by the sensor (i.e., the power detector). Aside from being connected to the third processor 310 of the BMC 300, the sensor management module 330 may be connected to the second processor 210 of the RBP 200, so as to allow the second processor 210 to obtain the measured data of the temperature sensor. After initialization of the third processor 310 has finished and after receiving the initiation message transmitted by the RBP 200, the BMC 300 continuously transmits the latest real-time monitoring output to the RBP 200 until the BMC 300 is not able to transmit the same (e.g., due to breakdown or shutdown). It should be noted that the BMC 300 automatically and periodically transmits the real-time monitoring output without waiting for a request transmitted by the RBP 200.

In step S805, after initialization of the second processor 210 of the RBP 200 has finished and after receiving the initiation me s sage transmitted by the RMC 100, the second processor 210 transmits periodically the at least a portion of the real-time monitoring output received from the BMC 300 via the second communication interface 220 to the first communication interface 120 of the RMC 100. In this step, the second processor 210 processes the real-time monitoring output received from the BMC 300, for example, filtering out unnecessary information or simplifying information contained in the real-time monitoring output to result in the at least a portion of the real-time monitoring output for subsequent transmission to the RMC 100. However, this step is not limited to the disclosure herein. The real-time monitoring output received from the BMC 300 may be directly relayed to the RMC 100 without being processed by the RBP 200. By virtue of the aforementioned steps S801 to S805, since the RCM 100 is capable of receiving the real-time monitoring output provided by each of the BMCs 300 without polling one by one the servers 700, communication time may be significantly reduced.

In one embodiment, the second processor 210 of the RBP 200, according to the real-time monitoring output received from the BMC 300, executes a control command to control operation of the server rack system (see step S800 in FIG. 4). The RBP 200 may further include a storage device for storage and update of the real-time monitoring output thus received. When the RBP 200 receives the initiation message from the RMC 100, the RBP 200 relays periodically the real-time monitoring output stored in the storage device to the RMC 100.

In one embodiment, the control command is associated with control of fan speed and/or duty cycle of the fan set 400. The second processor 210 of the RBP 200 calculates a target fan speed and/or a target duty cycle of the fan set 400 according to the real-time monitoring output thus received, and executes the control command associated with the fan speed thus calculated so as to control rotation of the fan set 400 according to the target fan speed and/or the target duty cycle. For example, when the RBP 200 determines that temperature of an electronic component in one or more of the servers 700 is relatively high based on the real-time monitoring output thus received, the RBP 200 controls a corresponding one of the fan sets 400 to increase fan speed, so as to promote heat dissipation. In one embodiment, the real-time monitoring output is categorized as one of a first level and a second level. The second processor 210 of the RBP 200 sorts the real-time monitoring output thus received based on the first level and the second level, and only transmits the real-time monitoring output which belongs to the second level via the second communication interface 220 to the first communication interface 120 of the RMC 100. The second processor 210 of the RBP 200 executes the control command according to the real-time monitoring output which belongs to the first level to control operation of the server rack system, for example, to determine whether or not heat dissipation of one of the servers 700 needs to be improved.

In one embodiment, after the control command is executed, the second processor 210 of the RBP 200 transmits a system event log which is associated with a result of execution of the control command via the second communication interface 220 to the first communication interface 120 of the RMC 100 (see step S800 in FIG. 4). The first processor 110 of the RMC 100 stores the system event log in the storage device 130. In this way, the RMC 100 may be alleviated from checking one by one the BMCs 300 of the servers 700 for a system event log stored in each of the BMCs 300, and only needs to check the system event log stored in the storage device 130 of the RMC 100, so that data throughput may be reduced and channel transmission efficiency may be increased. Moreover, each of the RBPs 200 is responsible for heat dissipation management of the corresponding multiple ones of the servers 700 which are connected to the RBP 200, and only reports an unusual event or the result of execution of the control command to the RMC 100. The RMC 100 is only responsible for the real-time monitoring unit which belongs to the second level.

In one embodiment, the real-time monitoring output which belongs to the second level indicates operational status of the server 700, such as underclocking or shutdown of the server 700. The first processor 110 of the RMC 100 determines whether or not to adjust output of the corresponding PSU 600 which is configured for power supply of the server 700 according to the operational status of the server 700. Accordingly, the first processor 110 of the RMC 100, according to the real-time monitoring output which belongs to the second level, executes the action command to control the output of the PSU 600, for example, to reduce output power or reduce output voltage (see step S806 in FIG. 4).

In one embodiment, the PDB 500 includes a monitoring circuit. When the monitoring circuit detects that one of the PSUs 600 has abnormal output, such as when the output exceeds a maximum power limit, the monitoring circuit is able to notify the server 700 which corresponds to the PSU 600 having abnormal output of the need to underclock or shut down, so power load of the PSU 600 may be kept within the maximum power limit.

In one embodiment, the RBP 200 is set with an inspection period for each of the servers 700. The second processor 210 of the RBP 200 according to the inspection period determines whether or not the BMC 300 of the server 700 continuingly transmits the real-time monitoring output.

Referring to FIGS. 3 and 5, aside from transmitting the aforementioned real-time monitoring output to the RBP 200, the server 700 further transmits irregular variation data, such as an Internet Protocol (IP) address, an IP mode, a hostname and so forth. The irregular variation data is transmitted only when configuration of the server 700 is changed, so data transmission may be further reduced.

In one embodiment, after receiving the initiation message transmitted by the RBP 200, the RMC 100 is acknowledged that initialization of the RBP 200 has finished and it is allowable to transmit a control command to the RBP 200. A target to be controlled by the control command may be the RBP 200, or the BMC 300 of the server 700 which is connected to the RBP 200. When the target to be controlled is the BMC 300, after receiving the initiation me s sage transmitted by the BMC 300, the RBP 200 relays the control command to the BMC 300.

Even though heat dissipation management and power management are given as an example in the aforementioned embodiments, the RMC 100 is further available for an administrator to inspect a resource list and an error report (e.g., hardware installation error), and is capable or issuing a notification. In this way, the real-time monitoring output, the control command and the action command are not limited to the disclosure herein.

To sum up, since polling is not adopted for collecting status parameters which are frequently transmitted (i.e., the real-time monitoring output), and since an approach of unidirectional transmission is adopted for saving time in data collection, the RMC 100 is allowed to respond instantly based on real-time data. Further, since data associated with the server 700 to be collected by the RMC 100 may be sorted first by the RBP 200 before passing to the RMC 100, data throughput may be reduced and channel transmission efficiency may be increased. In addition, a monitored result associated with each server 700 is processed by a corresponding RBP 200 so as to alleviate workload of the RMC 100 and so as to lower the difficulty in developing software of the RMC 100. By virtue of each of the RMC 100, the RBP 200 and the BMC 300 which transmits the initiation message to the connected component after initialization thereof has finished, the connected component that receives the initiation message is enabled to automatically transmit to-be-transmitted data to the source of the initiation message (the RMC 100, the RBP 200 or the BMC 300) which has been initialized without invoking the polling process.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A method of monitoring a server rack system, the server rack system including a rack management controller (RMC), a rack back plane (RBP) connected to the RMC, and a server connected to the RBP, the RMC including a first processor and a first communication interface, the RBP including a second processor, a second communication interface and a third communication interface, the server including a baseboard management controller (BMC) that includes a third processor and a fourth communication interface, the method comprising the following steps of:

initializing each of the first processor of the RMC, the second processor of the RBP and the third processor of the BMC;

transmitting, by the first processor of the RMC, an initiation message, which notifies that initialization of the first processor has finished, via the first communication interface to the second communication interface of the RBP after initialization of the first processor has finished, so the RBP is prepared to transmit at least one portion of a real-time monitoring output to the RMC;

after initialization of the second processor of the RBP has finished, by the second processor of the RBP, transmitting an initiation message, which notifies that initialization of the second processor has finished, via the third communication interface of the RBP to the fourth communication interface of the BMC so the BMC is prepared to transmit the real-time monitoring output to the RBP, and transmitting an initiation message, which notifies that initialization of the second processor has finished, via the second communication interface of the RBP to the first communication interface of the RMC, so the RMC is prepared to receive the at least one portion of the real-time monitoring output from the RBP;

transmitting, by the third processor of the BMC, an initiation message, which notifies that initialization of the third processor has finished, via the fourth communication interface of the BMC to the third communication interface of the RBP after initialization of the third processor has finished, so the RBP is prepared to receive the real-time monitoring output from the BMC;

transmitting periodically, by the third processor of the BMC, the real-time monitoring output associated with a condition of the server via the fourth communication interface of the BMC to the third communication interface of the RBP once receiving the initiation message transmitted by the RBP and after initialization of the third processor has finished, wherein the real-time monitoring output comprises one of a first level or a second level;

sorting, by the second processor of the RBP, the real-time monitoring output received from the BMC based on the first level or the second level;

transmitting periodically, by the second processor of the RBP, the at least one portion of the real-time monitoring output received from the BMC which belongs to the second level via the second communication interface of the RBP to the first communication interface of the RMC once receiving the initiation message transmitted by the RMC; and executing, by the second processor of the RBP, a control command according to a portion of the real-time monitoring output which belongs to the first level to control operation of the server rack system.

2. The method of claim 1, the server rack system further including a fan set that is connected to the RBP for heat dissipation of the server, wherein the step of executing the control command includes:

calculating, by the second processor of the RBP according to the real-time monitoring output, one of a target fan speed associated with the fan set and a target duty cycle associated with the fan set, and generating, by the second processor, a control command associated with one of the target fan speed and the target duty cycle; and executing, by the second processor of the RBP, the control command so as to control rotation of the fan set according to a corresponding one of the target fan speed and the target duty cycle.

3. The method of claim 1 the RMC further includes a storage device, subsequent to the step of executing a control command, the method further comprising the steps of:

transmitting, by the second processor of the RBP, a system event log which is associated with a result of execution of the control command via the second communication interface to the first communication interface of the RMC; and storing, by the first processor of the RMC, the system event log in the storage device.

4. The method of claim 1, the BMC further including a sensor management module which collects data measured by a sensor that is disposed on the server, the sensor being at least one of a temperature sensor, a voltage detector or a power detector, wherein, in the step of transmitting periodically a real-time monitoring output, the real-time monitoring output is at least one of a temperature associated with the server rack system detected by the temperature sensor, an operating voltage of an electronic component of the server rack system detected by the voltage detector, or power consumption of an electronic component of the server rack system detected by the power detector.

5. The method of claim 1, subsequent to the step of transmitting periodically the at least one portion of the real-time monitoring output, the method further comprising the step of:

executing, by the first processor of the RMC according to the real-time monitoring output which belongs to the second level, an action command to control operation of the server rack system.

6. The method of claim 5, the server rack system further including a power supply unit for power supply of the RBP and the server connected to the RBP, wherein, in the step of transmitting the real-time monitoring output which belongs to the second level, the real-time monitoring output which belongs to the second level indicates underclocking or shutdown of the server; and wherein the step of executing an action command includes executing, by the first processor of the RMC, the action command to control output of the power supply unit which is configured for power supply of the server that is underclocked or that has shut down.

7. The method of claim 1, the RBP is set with an inspection period for the server, subsequent to the step of transmitting periodically a real-time monitoring output, the method further comprising the step of:

determining, by the second processor of the RBP according to the inspection period, whether or not the server continuingly transmits the real-time monitoring output.

8. The method of claim 1, wherein, after receiving the initiation message transmitted by the RBP, the BMC is notified that the initialization of the second processor of the RBP has finished, and the BMC is prepared to transmit the real-time monitoring output to the RBP.

9. The method of claim 8, wherein, after receiving the initiation message transmitted by the RMC, the RBP is notified that the initialization of the first processor of the RMC has finished, and the RBP is prepared to transmit the at least one portion of the real-time monitoring output to the RMC.

10. A server rack system comprising:

a rack management controller (RMC) which includes a first processor and a first communication interface;

a rack back plane (RBP) which is connected to said RMC, and which includes a second processor, a second communication interface connected to said first communication interface, and a third communication interface; and a server which is connected to said RBP, and which includes a baseboard management controller (BMC) that includes a third processor and a fourth communication interface connected to said third communication interface;

wherein each of said first processor of said RMC, said second processor of said RBP and said third processor of said BMC is initialized;

wherein said first processor of said RMC is programmed to transmit an initiation message, which notifies that initialization of said first processor has finished, via said first communication interface to said second communication interface of said RBP after initialization of said first processor has finished, so said RBP is prepared to transmit at least one portion of a real-time monitoring output to said RMC;

wherein after initialization of said second processor of said RBP has finished, said second processor is programmed to transmit an initiation message, which notifies that initialization of said second processor has finished, via said third communication interface to said fourth communication interface of said BMC, so said BMC is prepared to transmit the real-time monitoring output to said RBP, and to transmit an initiation message, which notifies that initialization of said second processor has finished, via said second communication interface to said first communication interface of said RMC, so said RMC is prepared to receive the at least one portion of the real-time monitoring output from said RBP;

wherein said third processor of said BMC is programmed to transmit an initiation message, which notifies that initialization of said third processor has finished, via said fourth communication interface to said third communication interface of said RBP after initialization of said third processor has finished, so said RBP is prepared to receive the real-time monitoring output from said BMC;

wherein said third processor of said BMC is further programmed to transmit periodically the real-time monitoring output associated with a condition of said server via said fourth communication interface to said third communication interface of said RBP once receiving the initiation message transmitted by said RBP and after initialization of said third processor has finished, the real-time monitoring output comprises one of a first level or a second level;

wherein said second processor of said RBP is further programmed to sort the real-time monitoring output received from the BMC based on the first level or the second level;

wherein said second processor of said RBP is further programmed to transmit periodically the at least one portion of the real-time monitoring output received from said BMC which belongs to the second level via said second communication interface to said first communication interface of said RMC once receiving the initiation message transmitted by said RMC; and wherein said second processor of said RBP is further programmed to execute a control command according to a portion of the real-time monitoring output which belongs to the first level to control operation of the server rack system.

11. The server rack system of claim 10, wherein said first communication interface and said second communication interface adopt one of the Inter-Integrated Circuit (I²C) bus, the RS-485 standard, the Universal Serial Bus (USB), and the Ethernet technology.

12. The server rack system of claim 10, wherein said third communication interface includes a terminal compatible with one of the Peripheral Component Interconnect Express (PCIe) standard, the RJ45 standard, the RS232 standard and the RS485 standard, said third communication interface being configured for transmission of at least one of an I2C signal, a PWM signal, a signal from a tachometer, or a general purpose I/O (GPIO) signal via pins of said terminal.

13. The server rack system of claim 10, wherein said RMC further includes a storage device;

wherein said second processor of said RBP is further programmed to transmit a system event log which is associated with a result of execution of the control command via said second communication interface to said first communication interface of said RMC; and wherein said first processor of said RMC is further programmed to store the system event log in said storage device.

14. The server rack system of claim 10, wherein said first processor of said RMC is further programmed to execute, according to the real-time monitoring output which belongs to the second level, an action command to control operation of the server rack system.

15. The server rack system of claim 14 further comprising a power supply unit for power supply of said RBP and said server connected to said RBP;

wherein the real-time monitoring output which belongs to the second level indicates underclocking or shutdown of said server; and wherein said first processor of said RMC is further programmed to execute the action command to control output of the power supply unit which is configured for power supply of the server that is underclocked or that has shut down.

* * * * *